US010827618B2

(12) United States Patent
Mäki

(10) Patent No.: US 10,827,618 B2
(45) Date of Patent: Nov. 3, 2020

(54) ELECTRONIC DEVICE COMPRISING AN AUDIO CHANNEL ASSEMBLY

(71) Applicant: Huawei Technologies Co., Ltd., Shenzhen (CN)

(72) Inventor: Jouni Tapio Mäki, Helsinki (FI)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/496,853

(22) PCT Filed: Mar. 23, 2017

(86) PCT No.: PCT/EP2017/057014
§ 371 (c)(1),
(2) Date: Sep. 23, 2019

(87) PCT Pub. No.: WO2018/171887
PCT Pub. Date: Sep. 27, 2018

(65) Prior Publication Data
US 2020/0107446 A1    Apr. 2, 2020

(51) Int. Cl.
*H05K 1/18*     (2006.01)
*H04R 1/08*     (2006.01)
*H05K 3/34*     (2006.01)

(52) U.S. Cl.
CPC .......... *H05K 1/184* (2013.01); *H05K 3/3478* (2013.01); *H05K 2201/10083* (2013.01)

(58) Field of Classification Search
CPC ......... H05K 2201/10083; H05K 1/184; H04R 1/025; H04R 1/026; H04R 1/08; H04R 1/083; H04R 1/033; H04R 5/02; B60R 11/0217
See application file for complete search history.

(56) References Cited

U.S. PATENT DOCUMENTS 8,804,993 B2     8/2014  Shukla et al.
2007/0026905 A1  2/2007  Murray
2010/0272302 A1  10/2010 Feiertag et al.
(Continued)

FOREIGN PATENT DOCUMENTS

CN    101228774 A    7/2008
CN    102387454 A    3/2012
(Continued)

OTHER PUBLICATIONS

Foreign Communication From a Counterpart Application, PCT Application No. PCT/EP2017/057014, English Translation of International Search Report dated Dec. 20, 2017, 5 pages.
(Continued)

*Primary Examiner* — Hoa C Nguyen
(74) *Attorney, Agent, or Firm* — Conley Rose, P.C.

(57) ABSTRACT

An electronic device comprises a housing comprising an audio opening, a Printed Circuit Board (PCB) arranged inside the housing, a microphone mounted on the PCB, and an audio channel assembly. The audio channel assembly comprises a first opening coupled to the audio opening, and a second opening coupled to an input of the microphone, wherein an audio channel is formed between the first opening and the second opening. The audio channel assembly is mounted on the PCB using a soldering part.

20 Claims, 5 Drawing Sheets

(56) References Cited

U.S. PATENT DOCUMENTS

| | | | | |
|---|---|---|---|---|
| 2012/0087530 A1* | 4/2012 | Hawker | ............ | H04R 1/083 |
| | | | | 381/361 |
| 2012/0177237 A1 | 7/2012 | Shukla et al. | | |
| 2013/0129136 A1* | 5/2013 | Harney | ............ | H04R 1/342 |
| | | | | 381/355 |

FOREIGN PATENT DOCUMENTS

| | | |
|---|---|---|
| CN | 204652665 U | 9/2015 |
| CN | 105828226 A | 8/2016 |
| CN | 205726224 U | 11/2016 |
| WO | 2010062820 A2 | 6/2010 |

OTHER PUBLICATIONS

Foreign Communication From a Counterpart Application, PCT Application No. PCT/EP2017/057014, English Translation of Written Opinion dated Dec. 20, 2017, 7 pages.

* cited by examiner

200

ELECTRONIC DEVICE COMPRISING AN AUDIO CHANNEL ASSEMBLY

CROSS-REFERENCE TO RELATED APPLICATIONS

This application is a national stage of International Application No. PCT/EP2017/057014, filed on Mar. 23, 2017, which is hereby incorporated by reference in its entirety.

TECHNICAL FIELD

The invention relates to an electronic device comprising an audio channel assembly. Furthermore, the invention also relates to a method for mounting the audio channel assembly on a Printed Circuit Board (PCB) inside the electronic device.

SUMMARY

An objective of embodiments of the invention is to provide a solution which mitigates or solves the drawbacks and problems of conventional solutions.

Another objective of embodiments of the invention is to provide an audio channel assembly which provides improved audio quality in an electronic device.

The above and further objectives are solved by the subject matter of the independent claims. Further advantageous implementation forms of the invention can be found in the dependent claims.

According to a first aspect of the invention, the above mentioned and other objectives are achieved with an electronic device comprising: a housing comprising an audio opening; a Printed Circuit Board, PCB, arranged inside the housing; a microphone mounted on the PCB; and an audio channel assembly comprising a first opening connected to the audio opening, and a second opening connected to an input of the microphone, wherein an audio channel is formed between the first opening and the second opening; and wherein the audio channel assembly is mounted on the PCB by means of at least one soldering part.

Audio signals may propagate through the audio channel from the first opening to the second opening.

An electronic device according to the first aspect provides a number of advantages over conventional solutions. One such advantage is that the use of soldering to mount the audio channel assembly on the PCB decreases the length of the audio channel and thereby improves the audio quality in the electronic device. In addition, the use of soldering provides a simple, cheap, and fast process for mounting the audio channel assembly on the PCB, thereby decreasing the manufacturing cost of the electronic device.

In a first possible implementation form of an electronic device according to the first aspect, the soldering part is arranged adjacent to the second opening of the audio channel assembly.

In a second possible implementation form of an electronic device according to the first implementation form of the first aspect or to the first aspect as such, the soldering part encloses the second opening of the audio channel assembly.

The first and second implementation forms ensures good audio sealing between the audio channel assembly and the PCB. Further, the second implementation form provides a more robust mounting/attachment of the audio channel assembly to the PCB.

In a third possible implementation form of an electronic device according to any of the preceding implementation forms of the first aspect or to the first aspect as such, the microphone is mounted on a first side of the PCB and the audio channel assembly is mounted on a second side of the PCB, the first side of the PCB being located opposite to the second side of the PCB.

The third implementation form provides a PCB design which is suitable for implementation in an electronic device.

In a fourth possible implementation form of an electronic device according to the third implementation form of the first aspect, the PCB comprises a through hole connecting the second opening of the audio channel assembly to the input of the microphone.

The fourth implementation form provides a connection between the audio channel and the input of the microphone.

In a fifth possible implementation form of an electronic device according to any of the preceding implementation forms of the first aspect or to the first aspect as such, the audio opening substantially extends in a first plane and the PCB extends in a second plane perpendicular to the first plane.

The fifth implementation form defines the geometrical relationship between the audio opening and the PCB. This implementation form provides a geometrical configuration on which the design of the electronic device can be based.

In a sixth possible implementation form of an electronic device according to the fifth implementation form of the first aspect, a first section of the audio channel extends parallel to the second plane and a second section of the audio channel extends parallel to the first plane.

In a seventh possible implementation form of an electronic device according to the sixth implementation form of the first aspect, the first section of the audio channel and the second section of the audio channel are joined perpendicular to each other.

In an eighth possible implementation form of an electronic device according to the sixth or seventh implementation form of the first aspect, the first section of the audio channel comprises the first opening of the audio channel assembly and the second section of the audio channel comprises the second opening of the audio channel assembly.

The sixth, seventh, and eighth implementation forms provides a design of the audio channel which is suitable for implementation in an electronic device.

In a ninth possible implementation form of an electronic device according to any of the preceding implementation forms of the first aspect or to the first aspect as such, the electronic device further comprises a dust protection arranged between the audio opening and the first opening of the audio channel assembly.

The ninth implementation form protects the whole audio channel from impurities, thereby improving the audio quality.

In a tenth possible implementation form of an electronic device according to any of the preceding implementation forms of the first aspect or to the first aspect as such, the electronic device further comprises a moister net arranged between the audio opening and the first opening of the audio channel assembly.

The tenth implementation form protects the whole audio channel from moister, thereby improving the audio quality.

In an eleventh possible implementation form of an electronic device according to any of the preceding implementation forms of the first aspect or to the first aspect as such, the electronic device further comprises an audio sealing arranged between the audio opening and the first opening of the audio channel assembly.

The eleventh implementation form prevents audio leakage between the audio opening and the first opening of the audio channel assembly, thereby improving the audio quality.

In a twelfth possible implementation form of an electronic device according to any of the ninth to eleventh implementation forms of the first aspect or to the first aspect as such, at least one of the dust protection, the moister net, and the audio sealing is attached to a lip of the audio channel assembly, wherein the lip of the audio channel assembly encloses the first opening of the audio channel assembly.

The twelfth implementation form provides a simple and robust way of attaching at least one of the dust protection, the moister net, and the audio sealing to the audio channel assembly.

In a thirteenth possible implementation form of an electronic device according to any of the preceding implementation forms of the first aspect or to the first aspect as such, the audio channel assembly comprises a duct connecting the first opening of the audio channel assembly and the second opening of the audio channel assembly.

The duct surrounds the audio channel formed between the first opening of the audio channel assembly and the second opening of the audio channel assembly. Audio signals propagating through the audio channel is thereby propagating inside the duct. The duct may further be air tight to avoid audio leakage.

The thirteenth implementation form provides an improved audio channel which minimizes audio leakage.

According to a second aspect of the invention, the above mentioned and other objectives are achieved with a method for mounting an audio channel assembly on a PCB of an electronic device, the method comprises: arranging solder paste on an area of the PCB; placing the audio channel assembly on the area with the solder paste; applying thermal energy to the area with the solder paste so as to obtain at least one soldering part for mounting the audio channel assembly on the PCB.

A method according to the second aspect provides a number of advantages over conventional solutions. One such advantage is that the use of soldering provides a simple, cheap, and fast process for mounting the audio channel assembly on the PCB, thereby decreasing the manufacturing cost of the electronic device. In addition, the use of soldering to mount the audio channel assembly on the PCB decreases the length of the audio channel and thereby improves the audio quality in the electronic device.

Further applications and advantages of the present invention will be apparent from the following detailed description.

BRIEF DESCRIPTION OF THE DRAWINGS

The appended drawings are intended to clarify and explain different embodiments of the present invention, in which.

DETAILED DESCRIPTION

Embodiments of the invention provides an electronic device comprising an audio channel assembly. The audio channel assembly is mounted by soldering on a PCB inside the electronic device. The use of soldering allows the length of the audio channel to be minimized, thereby improving the audio quality in the electronic device.

Figure 1:
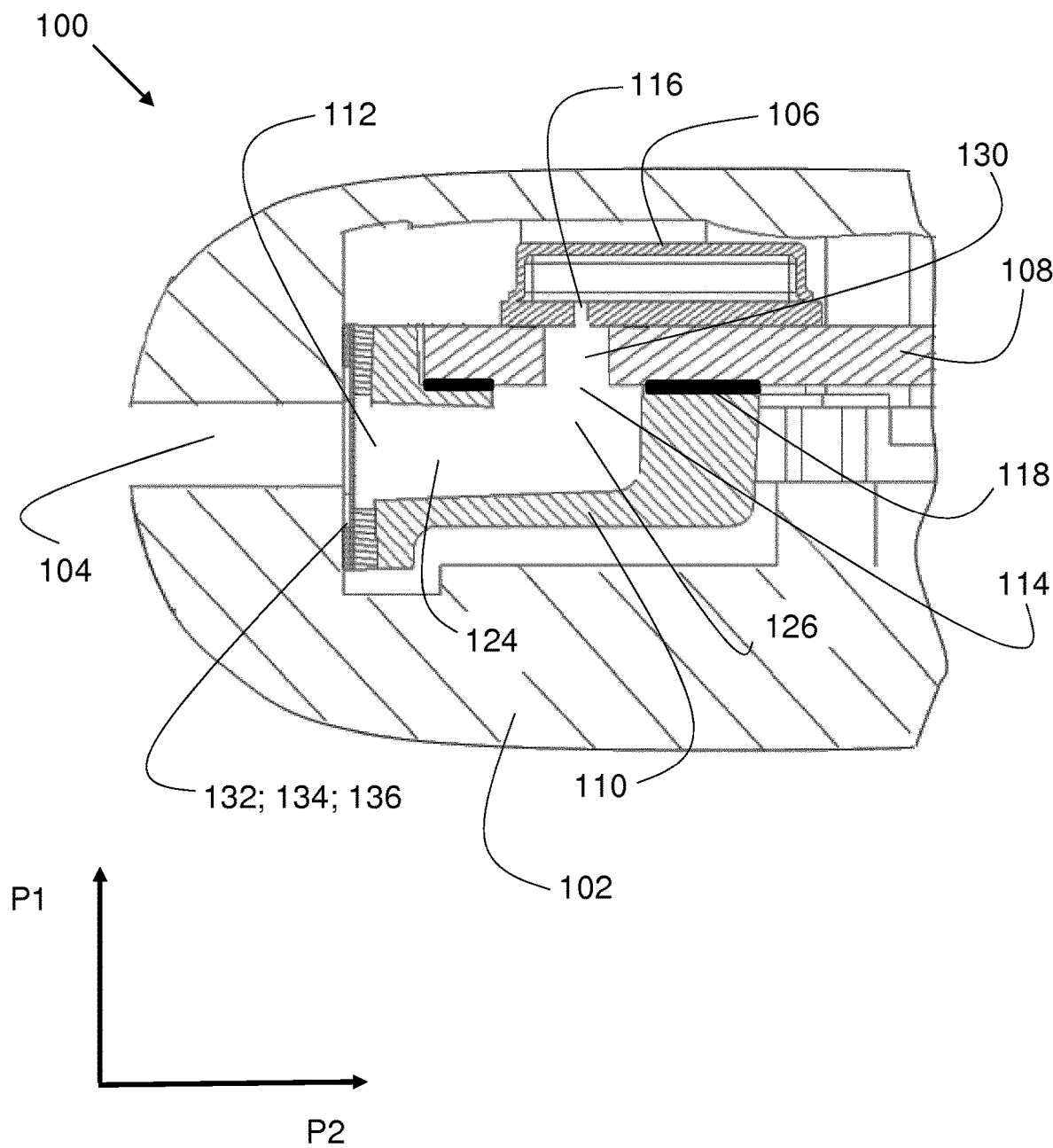
FIG. 1 shows a section of an electronic device according to an embodiment of the invention.

FIG. 1 shows a section of an electronic device 100 according to an embodiment of the invention. The electronic device 100 comprises a housing 102, and a PCB 108 arranged inside the housing 102. Further, the electronic device 100 comprises a microphone 106 mounted on the PCB 108, and an audio channel assembly 110. The housing 102 comprises an audio opening 104, which in the embodiment shown in FIG. 1 is located in the middle of one side of the housing 102. However, the location of the audio opening 104 may in other embodiments be different. The audio opening 104 may e.g. be located higher or lower than in the middle of the one side of the housing 102. Alternatively, the audio opening 104 may be located on another side of the housing, or at the top, or the bottom of the housing 102.

According to the invention the audio channel assembly 110 comprises a first opening 112 connected to the audio opening 104 and a second opening 114 connected to an input 116 of the microphone 106. An audio channel 124, 126 is formed between the first opening 112 and the second opening 114. Thereby, audio signals can propagate in the audio channel 124,126 from the audio opening 104 to the input 116 of the microphone 106.

Figure 5:
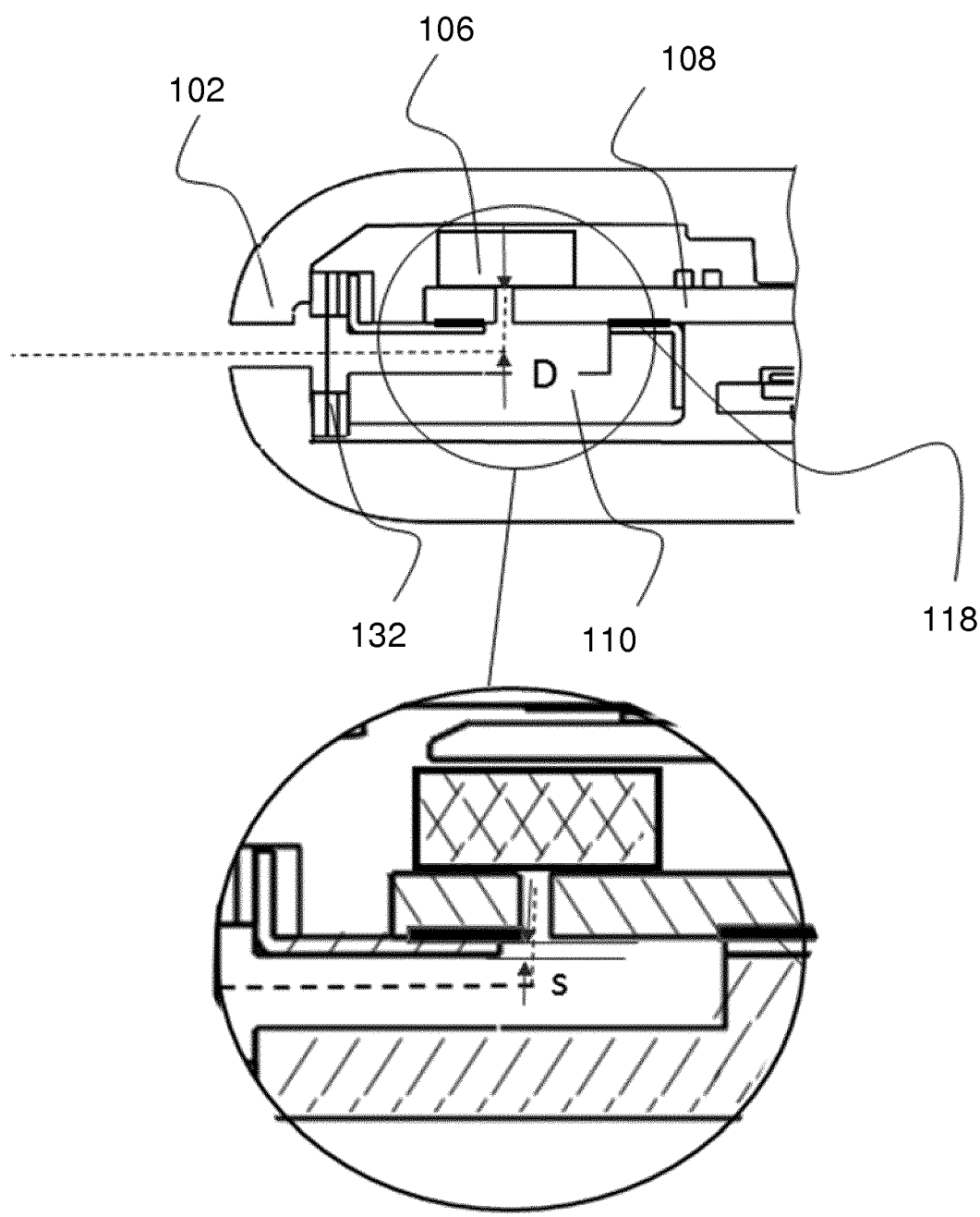
FIG. 5 shows a section of an electronic device according to an embodiment of the invention.

The audio channel assembly 110 is mounted on the PCB 108 by means of at least one soldering part 118. The soldering part 118 may have different size in different embodiments. Hence, one soldering part 118 may cover all, a large portion, or a small portion of the contact surface between the audio channel assembly 110 and the PCB 108. In a similar way, the location of the at least one soldering part 118 on the contact surface between the audio channel assembly 110 and the PCB 108 can be different in different embodiments. Thus, the soldering part 118 may in some embodiments be arranged adjacent to the second opening 114 of the audio channel assembly 110, as shown in FIG. 1. However, other locations of the soldering part 118 on the contact surface between the audio channel assembly 110 and the PCB 108 are also possible. Furthermore, the soldering part 118 may in some embodiments fully enclose the second opening 114 of the audio channel assembly 110. The use of at least one soldering part 118 to mount or attach the audio channel assembly 110 on the PCB 108 leads to the length of the audio channel being decreased, as will be described in more detail below, with reference to FIG. 5.

Figure 2:
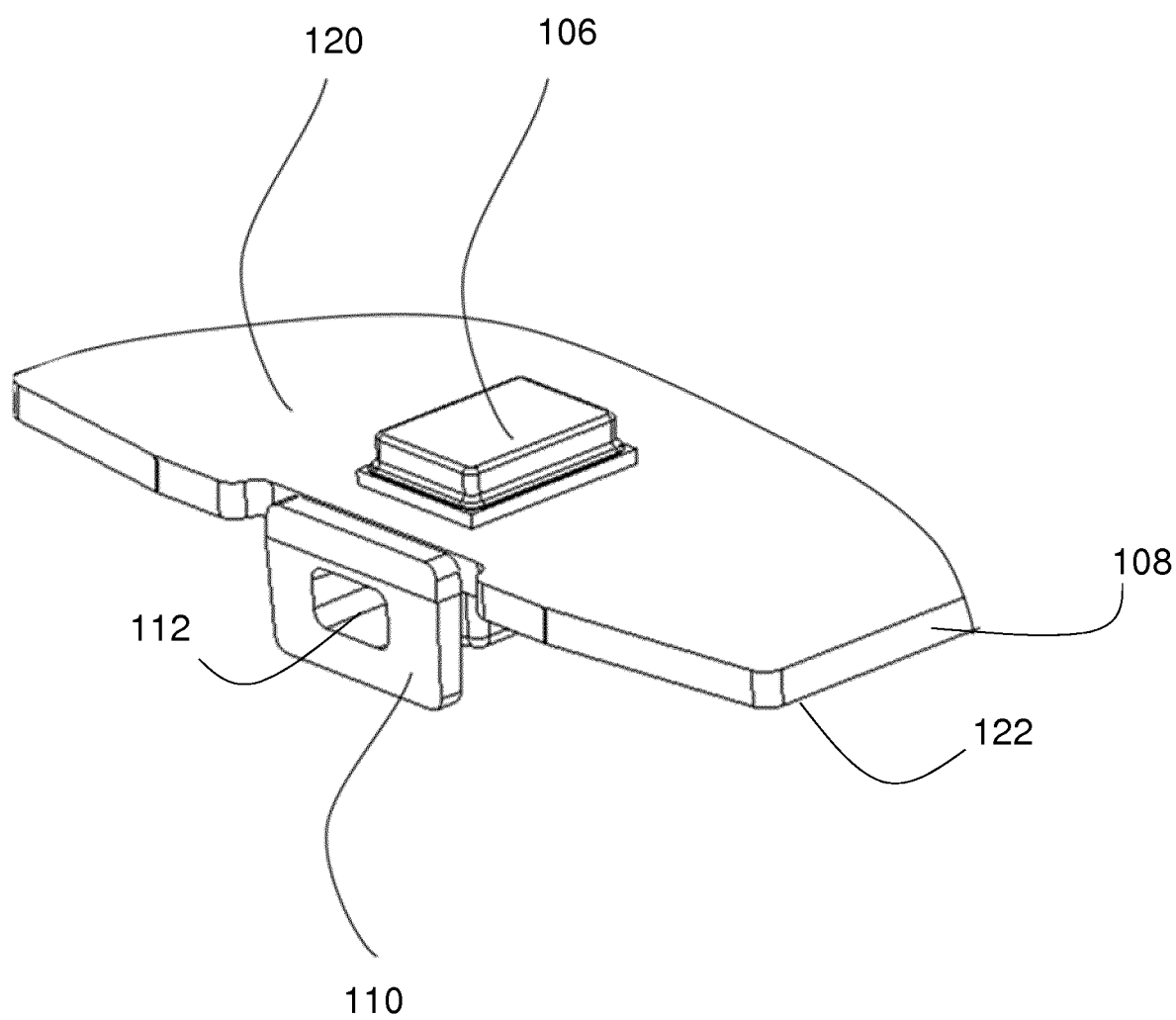
FIG. 2 shows the locations of a microphone, a PCB, and an audio channel assembly relative to each other according to an embodiment of the invention.

In an embodiment of an electronic device 100 according to the invention, the microphone 106 is mounted on a first side 120 of the PCB 108 and the audio channel assembly 110 is mounted on a second side 122 of the PCB 108. FIG. 2 shows the locations of a microphone 106, a PCB 108 and an audio channel assembly 110 relative to each other according to such an embodiment. As shown in FIG. 2, the first side 120 of the PCB 108 is located opposite to the second side 122 of the PCB 108. With the microphone 106 on the first side 120 of the PCB 108 and the audio channel assembly 110 on the second side 122 of the PCB 108, an opening is needed in the PCB 108 to allow the audio signals to pass through the PCB 108. Thus, the PCB 108 may comprise a through hole 130 connecting the second opening 114 of the audio channel assembly 110 to the input 116 of the microphone 106, as shown in FIG. 1.

FIG. 1 further shows the different parts and openings of the audio channel 124, 126 and how they are arranged relative to each other. In the embodiment shown in FIG. 1, the audio opening 104 substantially extends in a first plane P1 (illustrated with the arrow P1 in FIG. 1) and the PCB 108 extends in a second plane P2 (illustrated with the arrow P2 in FIG. 1) perpendicular to the first plane P1. Furthermore, a first section 124 of the audio channel 124, 126 extends parallel to the second plane P2 and a second section 126 of the audio channel 124, 126 extends parallel to the first plane P1. The first section 124 of the audio channel 124, 126 and the second section 126 of the audio channel 124, 126 may therefore be joined perpendicular to each other, as shown in FIG. 1. As also shown in FIG. 1, the first section 124 of the audio channel 124, 126 may comprise the first opening 112 of the audio channel assembly 110 and the second section 126 of the audio channel 124, 126 may comprise the second opening 114 of the audio channel assembly 110. Consequently, the first opening 112 of the audio channel assembly 110 and the second opening 114 of the audio channel assembly 110 may also be perpendicular to each other, as shown in FIG. 1.

As described above, FIG. 1 shows an embodiment where the first section 124 of the audio channel 124, 126 and the second section 126 of the audio channel 124, 126 are joined perpendicular to each other. However, the first section 124 of the audio channel 124, 126 and the second section 126 of the audio channel 124, 126 can also be joined at different angels than 90 degrees. One factor affecting the angel between the first section 124 of the audio channel 124, 126 and the second section 126 of the audio channel 124, 126 is the location of the audio opening 104. For example, if the audio opening 104 would be located lower than shown in FIG. 1 the angel between the first section 124 of the audio channel 124, 126 and the second section 126 of the audio channel 124, 126 would be more than 90 degrees. While, if the audio opening 104 would be located higher than shown in FIG. 1 the angel between the first section 124 of the audio channel 124, 126 and the second section 126 of the audio channel 124, 126 would be less than 90 degrees. Other factors, such as the location of the PCB 108 and the input 116 of the microphone 106, will also affect the angel between the first section 124 of the audio channel 124, 126 and the second section 126 of the audio channel 124, 126. Consequently, the angel between the first section 124 of the audio channel 124, 126 and the second section 126 of the audio channel 124, 126 may differ depending on the relative location between different parts of the electronic device 100.

Impurities from outside the electronic device 100 may enter the audio channel 124, 126 through the audio opening 104. Impurities impact the audio quality negatively and it is therefore desirable to prevent impurities from entering the audio channel 124, 126. According to embodiments of the invention different types of protection 132; 134 against impurities and moister may be arranged between the audio opening 104 and the first opening 112 of the audio channel assembly 110, as shown in FIG. 1. By placing the protection 132; 134 between the audio opening 104 and the first opening 112 of the audio channel assembly 110 the whole audio channel 124, 126 is protected from impurities. The protection 132; 134 may be a dust protection 132 and/or a moister net 134 which may be arranged over the first opening 112 of the audio channel assembly 110. Hence, the dust protection 132 and/or the moister net 134 may cover the first opening 112 of the audio channel assembly 110 and thereby protect the audio channel 124, 126 from dust and/or moister. The two types of protection 132; 134 may be used individually or in combination.

In addition, an audio sealing 136 may be arranged between the audio opening 104 and the first opening 112 of the audio channel assembly 110, as shown in FIG. 1. The audio sealing 136 may be arranged around the first opening 112 of the audio channel assembly 110, i.e. enclosing the first opening 112 of the audio channel assembly 110. Thereby, the audio sealing 136 prevents audio leakage into a space between the audio opening 104 and the first opening 112 of the audio channel assembly 110, i.e. in a direction extending radially from the audio opening 104 and the first opening 112 of the audio channel assembly 110.

Figure 3:
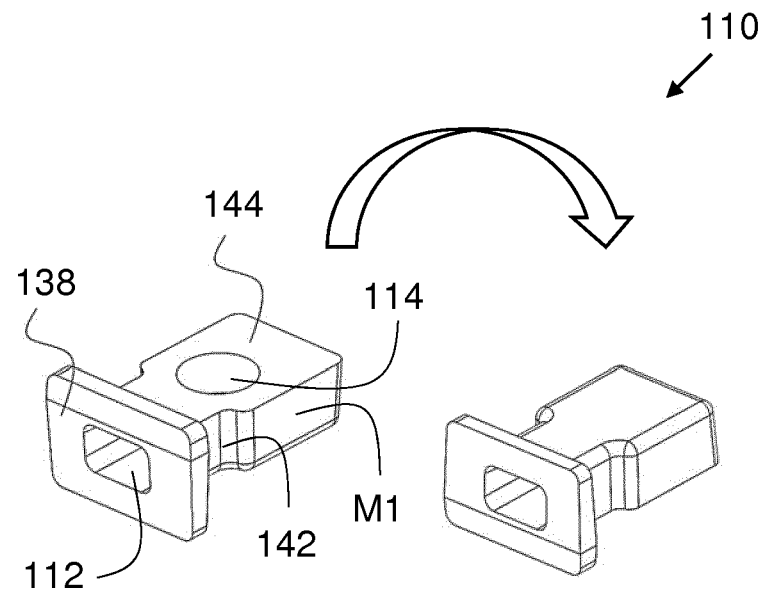
FIG. 3 shows an audio channel assembly according to an embodiment of the invention.
Figure 4:
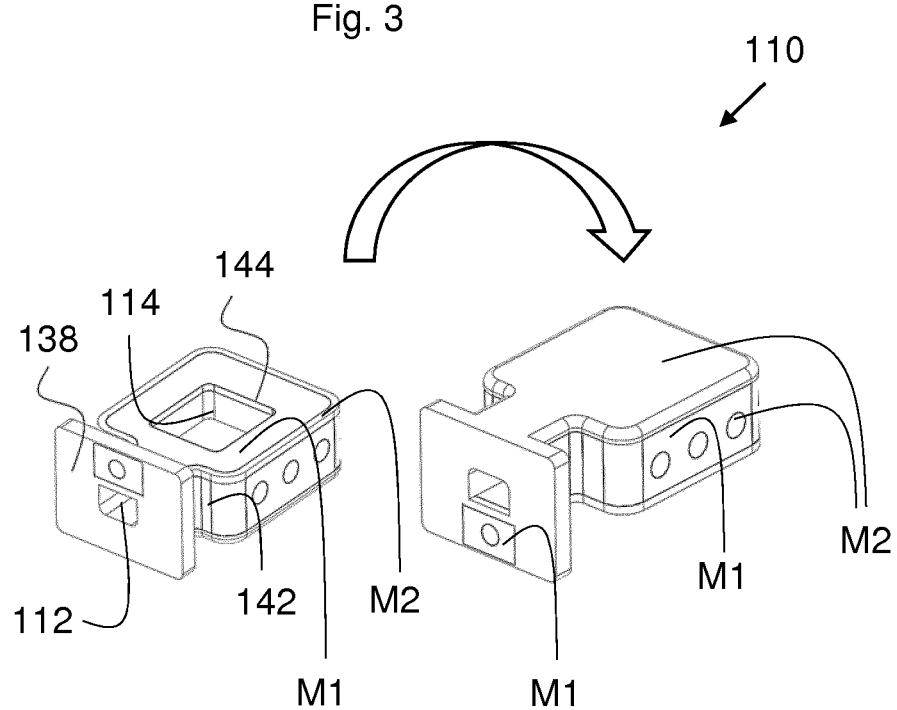
FIG. 4 shows an audio channel assembly according to another embodiment of the invention.

In some embodiments, at least one of the dust protection 132, the moister net 134, and the audio sealing 136 may be attached to a lip 138 of the audio channel assembly 110. The lip 138 of the audio channel assembly 110 is shown in FIGS. 3 and 4. As shown in FIGS. 3 and 4, the lip 138 of the audio channel assembly 110 may fully enclose the first opening 112 of the audio channel assembly 110. Furthermore, the lip 138 extends parallel to the extension of first opening 112 of the audio channel assembly 110 and perpendicular to the extension of the first section 124 of the audio channel 124, 126. The lip 138 may be made of the same material(s) as the audio channel assembly 110.

FIGS. 3 and 4 further shows different views of the audio channel assembly 110 according to the invention. On the left in FIGS. 3 and 4 the audio channel assembly 110 is shown from one side, herein referred to as the top view. While on the right in FIGS. 3 and 4 the audio channel assembly 110 is shown from an opposite side, herein referred to as the bottom view. The audio channel assembly 110 may comprise a duct/tube 142 connecting the first opening 112 of the audio channel assembly 110 and the second opening 114 of the audio channel assembly 110. The duct 142 surrounds the audio channel 124, 126 formed between the first opening 112 and the second opening 114. Audio signals propagating through the audio channel 124, 126 is thereby propagating inside the duct 142. The duct 142 may further be air tight to avoid audio leakage. The lip 138 of the audio channel assembly 110 may be connected to the audio opening 104. Furthermore, the dust protection 132, the moister net 134, and/or the audio sealing 136 may be attached to the lip 138, as described above.

The top view of the audio channel assembly 110 on the left in FIGS. 3 and 4 shows a top surface 144 of the audio channel assembly 110. The top surface 144 may enclose the second opening 114 of the audio channel assembly 110. Furthermore, the top surface 144 of the audio channel assembly 110 is the area of the audio channel assembly 110 which may be connected to the PCB 108. As the audio channel assembly 110 may be mounted on the PCB 108 by soldering, the top surface 144 of the audio channel assembly 110 should be made of a material which can be soldered such as a metal. In one embodiment, the audio channel assembly 110 may be made of a single material and said material may be a solderable metal. One such embodiment is shown in FIG. 3, where the audio channel assembly 110 is made of a single solderable material M1. In other embodiments, the audio channel assembly 110 may be made of a combination of two or more materials. In this case, at least the top surface 144 of the audio channel assembly 110 may be made of a solderable metal. The rest of the audio channel assembly 110 can be made of one or more different materials which does not have to be solderable, e.g. metal alloys, ceramics or plastics. The material of the top surface 144 may in such embodiments e.g. be plated or coated on top of the material(s) of the rest of the audio channel assembly 110. FIG. 4 shows an embodiment where the audio channel assembly 110 is made of a combination of two different materials M1, M2. In the embodiment shown in FIG. 4, the main body of the audio channel assembly 110 is made of a combination of material M1 and material M2. Material M1 is solderable while material M2 may be either solderable or non-solderable. However, the top surface 144 of the audio channel assembly 110 is made only of material M1 which is solderable.

In conventional electronic devices, a part providing an audio channel inside the electronic device is typically mounted on a PCB 108 using a gasket. The use of soldering to mount the audio channel assembly 110 on the PCB 108 according to the invention means that the distance D, shown in FIG. 5, may be decreased. The distance D is the distance between the input 116 of the microphone 106 and the middle of the first section 124 of the audio channel 124, 126. The use of soldering to mount the audio channel assembly 110 on the PCB 108 may decrease the distance D due to two factors. Firstly, the thickness of the soldering part 118 itself is typically thinner than the thickness of a gasket. Secondly, the material thickness S of the audio channel assembly 110 can be minimized when using soldering, as the material does not have to stand the pressing force caused by a gasket. The material thickness S of the audio channel assembly 110 is shown in the enlarged view in FIG. 5. Hence, both these two factors contribute to the distance D being decreased when soldering is used to mount the audio channel assembly 110 on the PCB 108. Furthermore, by decreasing the distance D the length of the audio channel 124, 126 is decreased which leads to improvements in the audio quality.

Figure 6:
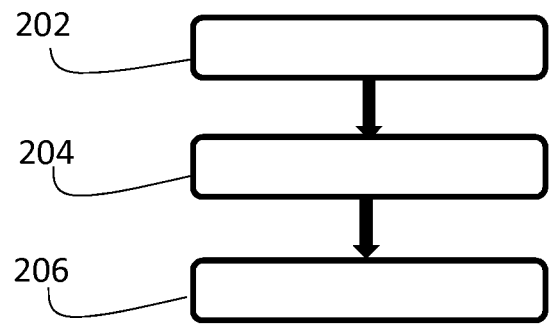
FIG. 6 shows a method according to an embodiment of the invention.
Figure 7:
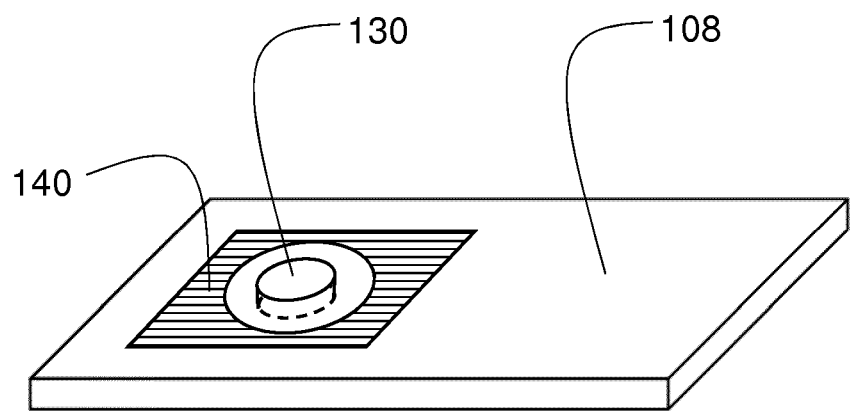
FIG. 7 shows a PCB and an area of the PCB according to an embodiment of the invention

FIG. 6 shows a flow chart of a corresponding method 200 for mounting an audio channel assembly 110 on a PCB 108 of an electronic device, such as the electronic device 100 shown in FIG. 1. The method 200 comprises arranging 202 solder paste on an area 140 of the PCB 108. FIG. 7 shows the area 140 of the PCB 108 according to an embodiment of the invention. In the embodiment shown in FIG. 7, the area 140 of the PCB 108 fully encloses the through hole 130 of the PCB 108. Furthermore, the shape of the area 140 of the PCB 108 is similar to the shape of the top surface 144 of the audio channel assembly 110 according to the embodiment shown in FIGS. 3 and 4. However, other locations and shapes of the area 140 of the PCB 108 are also possible.

The method 200 further comprises placing 204 the audio channel assembly 110 on the area 140 with the solder paste. The method 200 further comprises applying 206 thermal energy to the area 140 with the solder paste so as to obtain at least one soldering part 118 for mounting the audio channel assembly 110 on the PCB 108.

The electronic device 100 may be any electronic device enabled to communicate audio signals, e.g. any electronic device comprising an audio opening and a microphone. Examples of such electronic device are mobile phones, dictaphones, audio recording equipment, etc.

The electronic device 100 herein may in some systems e.g. be denoted as a user device, a User Equipment (UE), a mobile station, an internet of things (IoT) device, a sensor device, a wireless terminal and/or a mobile terminal, is enabled to communicate wirelessly in a wireless communication system, sometimes also referred to as a cellular radio system, or to communicate over wire in a wired communication system. The UEs may further be referred to as mobile telephones, cellular telephones, computer tablets or laptops with wireless capability. The UEs in the present context may be, for example, portable, pocket-storable, hand-held, computer-comprised, or vehicle-mounted mobile devices, enabled to communicate voice and/or data, via the radio access network, with another entity, such as another receiver or a server. The UE can be a Station (STA), which is any device that contains an IEEE 802.11-conformant Media Access Control (MAC) and Physical Layer (PHY) interface to the Wireless Medium (WM). The UE may also be configured for communication in 3GPP related LTE and LTE-Advanced, in WiMAX and its evolution, and in fifth generation wireless technologies, such as New Radio.

Finally, it should be understood that the invention is not limited to the embodiments described above, but also relates to and incorporates all embodiments within the scope of the appended independent claims.

The invention claimed is:

1. An electronic device, comprising:
   a one-piece housing comprising an audio opening;
   a printed circuit board (PCB) inside the housing;
   a microphone mounted on the PCB, wherein the PCB comprises a through hole in communication with a microphone input; and
   an audio channel assembly comprising:
   a first opening coupled to the audio opening;
   a top surface comprising a second opening, wherein the second opening is in communication with the through hole, wherein an audio channel is defined between the first opening and the second opening, and wherein the top surface comprises solderable material; and
   a lip coupled to the audio opening and enclosing the first opening; and
   a soldering part comprising the top surface, wherein solder affixes the soldering part to the PCB.

2. The electronic device of claim 1, wherein audio channel assembly comprises a single solderable material.

3. The electronic device of claim 1, wherein the soldering part surrounds the second opening.

4. The electronic device of claim 1, wherein the microphone is mounted on a first side of the PCB, and wherein the audio channel assembly is mounted on an opposing second side of the PCB.

5. The electronic device of claim 4, wherein a portion of the audio channel assembly is non-solderable material.

6. The electronic device of claim 1, wherein the audio opening extends in a first plane, and wherein the PCB extends in a second plane perpendicular to the first plane.

7. The electronic device of claim 6, wherein a first section of the audio channel extends parallel to the second plane, and wherein a second section of the audio channel extends parallel to the first plane.

8. The electronic device of claim 7, wherein the first section and the second section are joined perpendicular to each other.

9. The electronic device of claim 7, wherein the first section comprises the first opening, and wherein the second section comprises the second opening.

10. The electronic device of claim 1, further comprising a dust protection between the audio opening and the first opening.

11. The electronic device of claim 10, wherein the dust protection is attached to the lip.

12. The electronic device of claim 1, further comprising a moisture net between the audio opening and the first opening.

13. The electronic device of claim 12, wherein the moisture net is attached to the lip.

14. The electronic device of claim 1, further comprising an audio sealing between the audio opening and the first opening.

15. The electronic device of claim 14, wherein the audio sealing is attached to the lip.

16. The electronic device of claim 1, wherein the audio channel assembly comprises a duct coupling the first opening and the second opening.

17. The electronic device of claim 1, wherein a first surface of the audio channel assembly comprises metal.

18. The electronic device of claim 1, wherein a second surface of the audio channel assembly comprises metal.

19. The electronic device of claim 1, wherein a second surface of the audio channel assembly comprises ceramic.

20. The electronic device of claim 1, wherein a second surface of the audio channel assembly comprises plastic.

\* \* \* \* \*